United States Patent [19]

Shu et al.

[11] Patent Number: 4,694,205
[45] Date of Patent: Sep. 15, 1987

[54] MIDPOINT SENSE AMPLIFICATION SCHEME FOR A CMOS DRAM

[75] Inventors: Lee-Lean Shu, Milpitas; Tai-Ching Shyu, San Jose, both of Calif.

[73] Assignee: Advanced Micro Devices, Inc., Sunnyvale, Calif.

[21] Appl. No.: 740,356

[22] Filed: Jun. 3, 1985

[51] Int. Cl.[4] .................. H03K 17/04; H03K 17/687; H03K 3/356; H03K 19/01

[52] U.S. Cl. ................................... 307/530; 307/355; 307/605; 365/203; 365/205

[58] Field of Search ............... 307/530, 269, 355, 362, 307/594, 596, 597, 601, 602, 603, 605; 365/203, 205

[56] References Cited

U.S. PATENT DOCUMENTS

| | | | |
|---|---|---|---|
| 3,976,895 | 8/1976 | Koo | 307/355 |
| 4,061,999 | 12/1977 | Proebsting et al. | 307/530 X |
| 4,119,870 | 10/1978 | Zibert | 307/355 |
| 4,119,871 | 10/1978 | Zibert | 307/355 |
| 4,274,013 | 6/1981 | Clemons et al. | 307/530 |
| 4,421,996 | 12/1983 | Chuang et al. | 307/530 |
| 4,551,641 | 11/1985 | Pelley, III | 307/530 |
| 4,555,777 | 11/1985 | Poteet | 365/205 |

FOREIGN PATENT DOCUMENTS 38794 2/1985 Japan .................... 365/205

OTHER PUBLICATIONS

Chao et al, "CMOS Sense-Restore Circuits for One Device FET Dynamic RAM"; *IBM-TDB*; vol. 25, No. 10, pp. 5088–5091; 3/1983.
Kuo et al, "16-K RAM Built with Proven Process May Offer High Start-Up Reliability"; *Electronics;* pp. 81–86; 5/13/76.

*Primary Examiner*—Stanley D. Miller
*Assistant Examiner*—David R. Bertelson
*Attorney, Agent, or Firm*—Eugene H. Valet; Patrick T. King; Warren Wolfeld

[57] ABSTRACT

A CMOS, midpoint sense amplification system for controlling the dynamics of the sense amplification phase of the sense cycle of a CMOS DRAM. The system includes a tracking circuit for initiating the first stage of the sense amplification phase when the differential voltage signal attains a first predetermined value. Circuitry for controlling the sense amplification rate and equalizing current supplied to the source nodes during the first stage is disclosed. In one embodiment, circuitry for detecting when the amplitude of the signal has increased to a second predetermined value and for increasing the sense amplification rate during the second and third stages of the sense amplification phase is disclosed.

17 Claims, 9 Drawing Figures

MIDPOINT SENSE AMPLIFICATION SCHEME FOR A CMOS DRAM

BACKGROUND OF THE INVENTION

1. Field of the Invention

The invention relates generally to IC CMOS dynamic random access memories (DRAMS), and more particularly, to a system for controlling the timing of the sense cycle in a CMOS DRAM.

2. Description of the Relation Art

Recent advances in CMOS technology have allowed memory circuit designers to realize the power reduction inherent in CMOS design while achieving high density. However, as memory cell size decreases to allow for high density, the susceptibility of alpha particle induced soft errors in the array increases. A CMOS DRAM utilizing PMOS memory cells disposed in an N well formed in a PMOS substrate significantly reduces this soft error susceptibility.

In a CMOS DRAM, digital information is stored in the form of capacitive charge in a storage cell, which can be addressed and sensed by conventional external means. The charge increment in the storage cell is sensed by means of a CMOS sensing circuit, including PMOS and NMOS cross-coupled latches, incorporated into a common integrated circuit die. The CMOS sense amp senses the differential signal voltage developed between right and left bit lines coupled to input nodes of the sense amp. This differential signal voltage is the difference between the voltage levels on a "high" bit line and a "low bit" line. The polarity of the differential signal voltage indicates the value of the stored bit. Timing of the sense operation is critical to the correct comparison of charge on the opposing bit lines. The sense cycle time, that is, the time required of the memory to address the desired bit, allow the differential voltage signal to stabilize, and to amplify the differenial signal voltage, is a significant portion of the total read access time of the memory. In the process of accessing data, speed anc accuracy are essential and competing factors. Design tradeoffs are necessary to optimize memory access speed without sacrificing accuracy.

Designs for CMOS DRAMS utilizing CMOS sense amps have been proposed in papers by Chwang et al. entitled "A 70 ns High Density CMOS DRAM," IEEE International Solid State Conference Proceedings, 22383, p. 56; Kawamoto et al. entitled "256K/1Mb DRAMS—II," 1984 IEEE International Solid States Circuits Conference Proceedings, Feb. 24, 1984, pp. 276-277; and by Kung et al. entitled "A Sub-100 ns 56K DRAM in CMOS III Technology," 1984 IEEE International Solid States Circuits Conference Proceedings. Feb. 24, 1984, pp. 278-279.

Generally, the sense cycle described in each of these references includes the following steps:
 (a) the bit lines are precharged to $V_{CC}/2$ where $V_{CC}$ is the external voltage supply level;
 (b) the bit is sensed by pulling the high bit line to $V_{CC}$ with the PMOS cross-coupled latch of the sense amp; and
 (c) the lines are actively restored by pulling the low bit line to ground with the NMOS cross-coupled latch.

These sense cycles having a sense amplification phase including a sense operation followed by a restore operation have several inherent disadvantages. First, the access time is increased because only the PMOS half of the CMOS sense amp is doing the sensing. Secondly, unequal capacitances in the bit line and the complementary bit line cause the signal to be lost during the sequential PMOS pull up and the NMOS pull down of the high bit line and the low bit line, respectively. For example, if the capacitance of a given bit line were substantially smaller than the capacitance of the other bit line, the given bit line would be pulled up during the PMOS pull up operation regardless of the polarity of the differential signal voltage developed between the bit lines.

A critical aspect of the sense cycle is the control of the time delay between the initiation of the charge transfer between the storage cell and the bit line and the application of source current to the sense amplifier to amplify the differential signal voltage.

The transfer of charge is characterized by the RC time constant of the storage cell and transfer gate and, thus, the increase in the magnitude of the differential signal voltage is also characterized by this constant. To avoid sense errors, it is imperative not to begin the sense amplification phase until the differential signal voltage is near its maximum value.

In many existing systems, the charge transfer trigger and sense amplifier clock signals were clocked at a fixed delay to allow the differential signal voltage to stabilize. Systems of this type cannot be optimized for speed in order to assure functionality over a wide range of fabrication process parameters and operating conditions. Such circuit designs result in slow memories as compared with the maximum speed obtainable in circuits with the best process parameters.

A further critical aspect of the sense operation is the control of the rate at which source current is applied to the sense amplifier. If this source current is increased too quickly the signal can be lost due to parasitic capacitive coupling between the source electrodes and the bit lines.

Typical systems utilize transistors, scaled to act as linear resistors wnen their gates are activated by a digital gate signal, to control the rate of increase of the sense amp source current. At best, the dynamic characteristic achieved by these systems is only a piecewise linear approximation to an optimal dynamic characteristic.

As described above, differences between the capacitance of the bit lines can cause signal loss during an independent pull up or pull down operation. In many systems, the capacitance of bit lines is substantially equal, however, during the sense cycles a selected one of the bit lines is coupled to a memory cell so that total capacitance of the selected bit line increases to $C_{BL}+C_{ST}$. The other one of the bit lines is either coupled to a dummy memory cell or remains isolated during the sense cycle so that its total capacitance is either $C_{\overline{BL}}$ or $C_{BL}+C_D$. Thus, the total capacitance of the given bit line coupled to $C_{ST}$ is not equal to the total capacitance of the other bit line if the other bit line remains isolated during the sense cycle or if $C_D$ is not equal to $C_{ST}$. Accordingly, a sense system utilizing non-simultaneous pull up and pull down cycles could cause signal loss for these types of systems.

Therefore, a system for initializing the source clock sequence to improve accuracy without degrading speed, for controlling the rate at which the source current is applied to the sense amplifier to prevent signal loss, and for simultaneously clocking the PMOS and NMOS cross-coupled latches to sense the stored bit is needed to improve the speed and accuracy of a CMOS DRAM.

SUMMARY OF THE INVENTION

The present invention is a CMOS sense amplifier clocking system that controls the dynamics of the sense amplification phase of the sense cycle to increase speed without degrading accuracy. The CMOS sense amp includes a pull-up latch, for pulling the high bit line to $V_{CC}$ when source current is supplied to the source node of the latch, and a pull-down latch, for pulling the low bit line to ground when source current is sunk from the source node of the latch.

The sense cycle includes a differential voltage signal generation phase initiated by coupling a storage cell to a selected bit line. As charge is transferred between the storage cell and the selected bit line the magnitude of the differential voltage increases at a finite rate. Given enough time, the value of the signal would attain a maximum value, $\Delta$, determined by $C_{BL}$, $C_{ST}$, and the voltage levels on the bit line and storage cell. During the signal generation phase, the source nodes of the sense amp are biased at the precharge level.

The sense amplification phase of the sense cycle is initiated some time interval after the initialization of the signal generation phase by changing the voltage levels on the source nodes of the sense amp from the precharge level.

In the present invention, the sense amplification phase is initialized when the amplitude of the differential voltage signal has reached a first predetermined level equal to a selected percentage, e.g. 90%, of $\Delta$.

The selected percentage represents a desired trade off between speed (which is reduced by waiting for the signal amplitude to attain the full value $\Delta$) and accuracy (which is increased by allowing the signal amplitude to approach $\Delta$).

During the first stage of the sense amplification phase, the amplitude of the differential voltage signal may start to decrease, due to mismatches between circuit parameters, as the voltage at the source nodes is changed from the precharge value. The signal is very unstable during this first stage and is easily lost.

According to one aspect of the present invention, the sense amplification rate is controlled during this first stage to prevent signal loss due to parasitic capacitive coupling between the source nodes and bit lines.

According to a further aspect of the invention, the current at the source nodes is equalized during this first stage to prevent signal loss due to unequal capacitive loads at the inputs of the sense amp.

When the amplitude of the differential voltage signal is amplified to at least a second predetermined value, the signal stabilizes and the second stage of the sense amplification phase is initiated.

According to a further aspect of the invention, this second predetermined value is detected and the current at the source nodes increased to increase the sense amplification rate and decrease the duration of the sense cycle.

According to a still further aspect of the invention, the sense amplification rate is further increased when the amplitude of the differential voltage signal is amplified to a third predetermined level to quickly latch the signal to the full output value.

In a preferred embodiment, the source current at each source node is controlled by first, second, and third source current transistors connected in parallel. Clocking circuitry controls the gate signals at each transistor.

The clocking circuitry includes a tracking circuit for clocking a tracking output signal when the amplitude of the differential signal voltage signal attains the first predetermined level.

The tracking circuit utilizes circuit elements that emulate the circuit characteristics of the bit line and transfer gate to determine when the amplitude of the signal attains the first predetermined value.

This emulation technique provides for reliable operation and optimal performance over a wide range of temperature and fabrication process parameter variations.

The tracking circuit output signal triggers a first slave clock with outputs coupled to the gates of the first source current transistors. The magnitude of the first slave clock outputs is controlled to bias one of the source nodes at a selected bias voltage level. This selected level controls the amplification rate to prevent signal loss.

The tracking circuit also utilizes a current mirror technique to equalize the current at the source nodes during the first stage.

A second slave clock receives the output signals from the first slave clock and clocks the second slave clock output signals when the differential voltage signal is amplified to the second predetermined level. The second slave clock output signals are coupled to the gates of the second source current transistors. These transistors conduct when the output signals are clocked to increase the current at the source nodes and increase the sense amplification rate.

The second slave clock utilizes circuitry that emulates the first source current transistors and the transistors in the sense amp to determine when the amplitude of the differential voltage signal has been amplified to the second predetermined value.

A third slave clock receives the output signals from the second slave clock and clocks the third slave clock output signals after a fixed time delay from the clocking of second slave clock output signals.

The third slave clock output signals are coupled to the gates of the third source current transistors. Theses transistors conduct when the output signal is clocked to further increase the sense amplification rate.

Accordingly, the present invention is a clocking system that controls the dynamics of the sense amplification phase of the sense cycle to provide high speed without sacrificing accuracy.

DETAILED DESCRIPTION OF THE PREFERRED EMBODIMENT

The present invention is a system for clocking the sense cycle in a CMOS DRAM to simultaneously sense a stored bit through the PMOS and NMOS cross-coupled latches of a CMOS sense amp.

Figure 1:
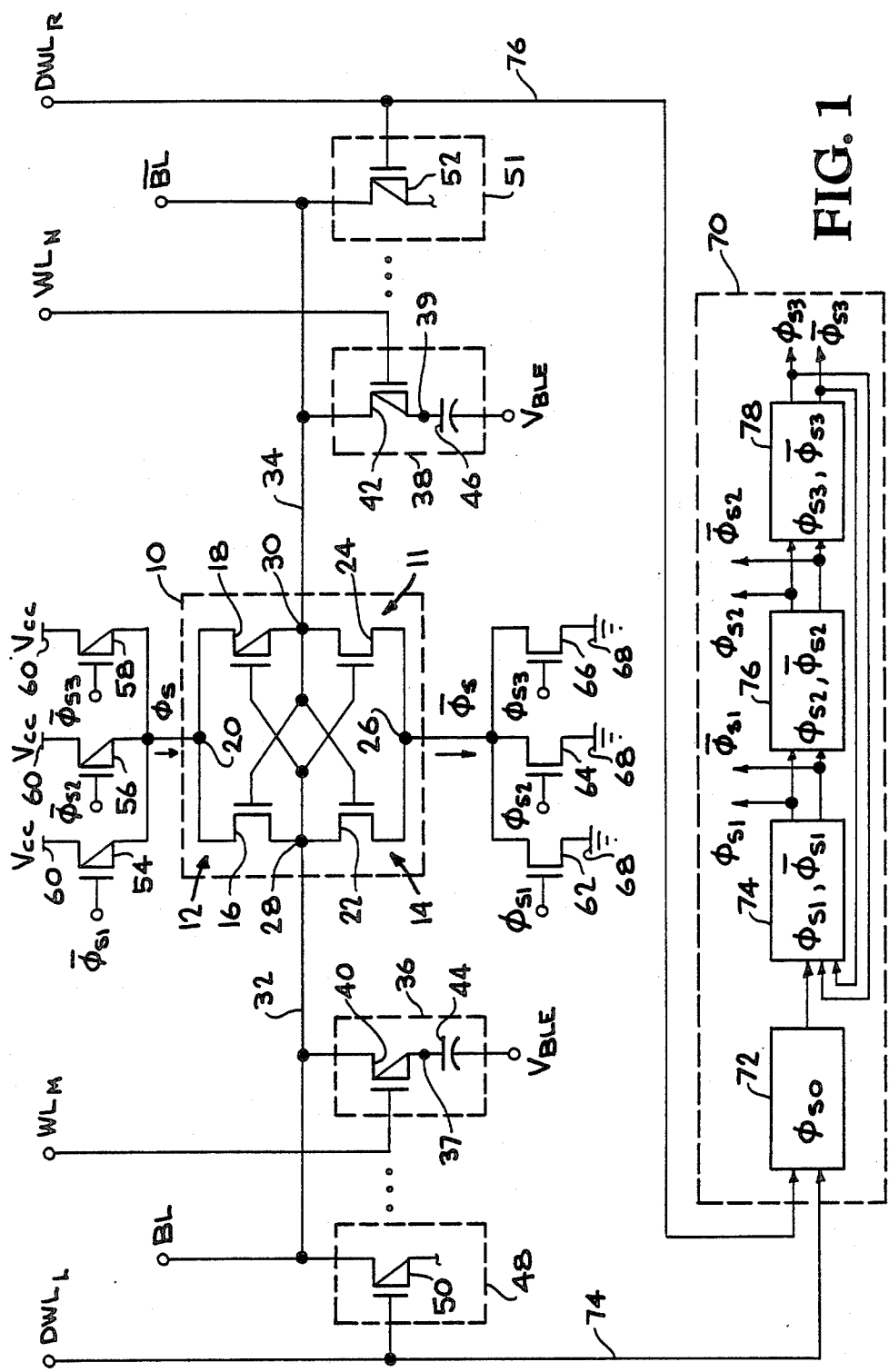
FIG. 1 is a schematic diagram of an embodiment of the invention.

FIG. 1 is a schematic diagram of a preferred embodiment of the present invention. Referring now to FIG. 1, a CMOS sense amp 10 includes a PMOS cross-coupled latch 12 and an NMOS cross-coupled latch 14. The PMOS cross-coupled latch 12 includes first and second cross-coupled PMOS transistors 16 and 18 having their source terminals coupled to a PMOS source node 20. The NMOS cross-coupled latch 14 includes first and second cross-coupled NMOS transistors 22 and 24 having their source terminals coupled to an NMOS source node 26. The drains of the first PMOS and NMOS transistors 16 and 22 are of the second PMOS and NMOS transistors 18 and 24 are coupled to a second input node 30. The first input node 28 is coupled to a left bit line 32 and the second input node 30 is coupled to a right bit line 34.

A left side storage cell 36, including storage node 37, and a right side storage cell 38, including storage node 39, are coupled, respectively, to the left bit line 32 and the right bit line 34. A plurality of bit cells is coupled to each bit line, each one of which is accessed by means of a wod line or a row address select signal ($WL_M$ for left bit lines and $WL_N$ for right bit lines) which switches a transfer gate 40, 42. When the transfer gate 40, 42 is on, a storage capacitor 44, 46 is electrically coupled to the respective bit line 32, 34 so that the charge on the storage nodes 37, 39 can be sensed on the bit line 32, 34. Each bit line 32, 34 has inherent capacitance between the bit line 32, 34 and the substrate. This inherent capacitance, together with the inherent resistance of the bit lines, gives rise to a characteristic RC time constant. The RC delay of the bit line is a significant parameter in a circuit, particularly in a very dense capacitance storage circuit.

Coupled to each bit line is a dummy storage cell 48, 51, respectively. Each dummy storage cell includes a dummy transfer gate 50 and 52. The function of the dummy storage cell will be described below.

The PMOS source node 20 is coupled to the drain terminals of first, second, and third PMOS source current supply transistors 54, 56, and 58. The source terminal of each of these PMS transistors 54, 56, and 58 is coupled to the $V_{CC}$ terminal 60 of an external power supply. The NMOS source node 26 is coupled to the drains of first, second, and third NMOS source current sink transistors 62, 64 and 66. The sources of each of the NMOS transistors 62, 64, 66 is coupled to the ground terminal 68 of the external power supply.

The source clock circuitry 70 comprises a tracking circuit 72 responsive to either of the dummy word line signals through a left dummy word line 74 or a right dummy word line 76 with the dummy word lines 74, 76 also coupled to the gate electrode of the respective dummy cell transfer gate 50, 52. The output of the tracking circuit is coupled to a first slave clock 74 having a first output signal characteristic. The first slave clock generates first and second first slave output signals, $\phi_{S1}$ and $\phi_{\overline{S1}}$, respectively. The first and second first slave clock output signals are coupled to the gates of the first PMOS current supply transistor 54 and the first NMOS source current sink transistor 62, respectively.

Additionally, these first slave clock output signals are coupled to a second slave clock 76. The second slave clock 76 generates first and second slave clock output signals, $\phi_{S2}$ and $\phi_{\overline{S2}}$ respectively. These second slave clock output signals are coupled to the gates of the second PMOS source current supply transistor 56 and the second NMOS source current sink transistor 64, respectively. Additionally, the second slave clock output signals are coupled to a third slave clock 78. The third slave clock 78 generates third slave clock output signals $\phi_{S3}$ and $\phi_{\overline{S3}}$, respectively. These third slave clock output signals are applied to the gates of the third PMOS current source supply transistor 58 and the third NMOS current source sink transistor 66, respectively.

Figure 2A:
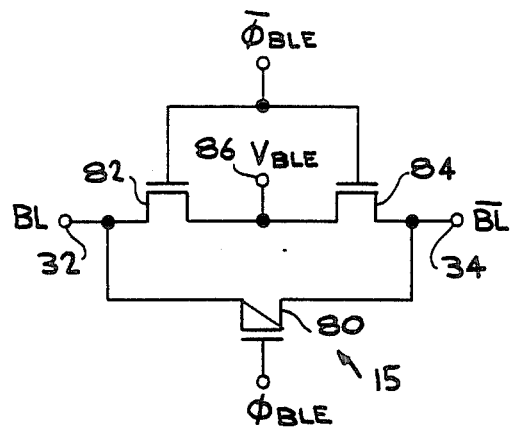
FIGS. 2A and 2B are circuit diagrams of precharging circuitry.
Figure 2B:
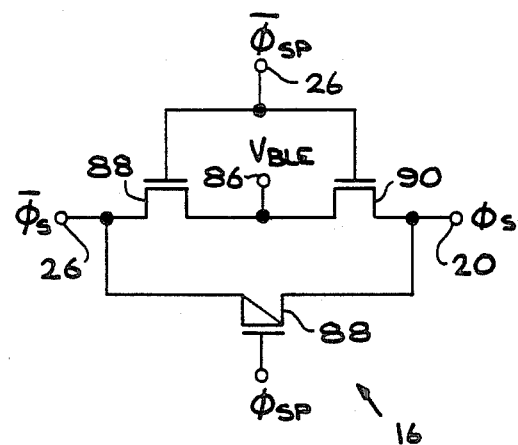

FIGS. 2A and 2B are diagrams of circuits for precharging the bit lines 32 and 34 and source current nodes 20 and 26 respectively. Referring first to FIG. 2A, the system includes a first PMOS coupling transistor 80 for controllably coupling the left and right bit lines 32 and 34. Additionally, first and second NMOS biasing transistors 82 and 84 couple the left and right bit lines 32 and 34 to a $V_{BLE}$ input 86. The gate of the first coupling transistor 80 is coupled to a $\phi_{BLE}$ signal and the gates of the first and second biasing transistors 82 and 84 are coupled to a $\phi_{\overline{BLE}}$ signal.

In FIG. 2B, a second PMOS coupling transistor 88 couples the PMOS source node 20 and the NMOS source node 26. These nodes 26 and 20 are coupled to the $V_{BLE}$ input 86 by third and fourth NMOS biasing transistors 88 and 90. The gate of the second coupling transistor 88 is coupled to a $\phi_{SP}$ signal and the gates of the third and fourth biasing transistors 88 and 90 are coupled to a $\phi_{\overline{SP}}$ signal.

Figure 3:
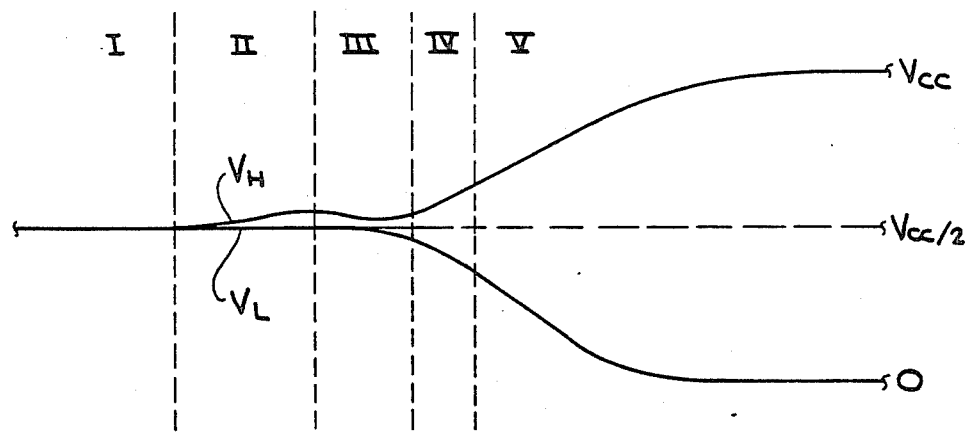
FIG. 3 is a graph of the differential signal voltage as a function of time.

An overview of the functioning of the various components of the sense clock circuitry 70 will now be presented with reference to FIG. 3. FIG. 3 is a graph depicting the generation and amplification of the differential voltage signal during the sense cycle.

Referring now to FIG. 3, various time periods are labeled by Roman numerals I–V. During period I the bit lines 32 and 34 and the storage cells 36 and 38 are all precharged to $V_{CC}/2$. A system for biasing the CMOS memory array is disclosed in the co-pending, commonly assigned patent application by Chuang et al., entitled "CMOS Memory Array Bias Scheme"

The sense cycle is initiated by clocking one of the word line signals, e.g., $WL_R$, to switch the right transfer gate 42. When the storage capacitor is coupled to the right bit line 34 the voltage level either decreases or increases slightly depending on whether a "1" or "0" is stored in the storage cell 38. Thus, the voltage level on the right but line 34 is either higher or lower than the voltage level on the left bit line.

During the differential voltage signal generation phase, period II, this difference between the voltage levels slowly increases is charge is transferred between the storage cell 38 and the bit line 34.

At this stage a critical performance tradeoff results. To assure accuracy, the amplitude of the differential voltage signal should be as large as possible before initiating the sense amplification phase of the sense cycle. However, due to the slow rate of increase of this signal, waiting for the signal to reach its maximum amplitude results in a slow memory.

In many systems, a fixed delay circuit is utilized to control the duration of period II. In the present system, the tracking circuit 72 is clocked by the $DWL_L$ signal at the same time that the right bit line 32 is coupled to the right storage cell 38. Because the $WL_R$ and $DWL_L$ are clocked together, the switching circuit 72 may be viewed as being clocked by $WL_R$.

The tracking circuit 72 sets the magnitude of period II so that the amplitude of differential voltage signal attains a first predetermined value, equal to about 90% of its maximum possible value, during period II.

The sense amplification phase of the sense cycle is initiated at the beginning of period III. This phase is divided into first, second, and third stages (time periods III, IV, and V, respectively).

At the end of period II the tracking circuit 72 triggers the first slave clock 74. Note that during the first stage (III) of the sense amplification phase the amplitude of the differential signal voltage is very small and they actually start to decrease due to sense amp mismatch and $C_{BL}$, $C_{\overline{BL}}$ mismatch. It is imperative that the rate of amplification be kept low during period III so that the differential voltage signal is not lost due to parasitic capacitive coupling.

The output signals from the first slave clock 74 controls the $V_{GS}$ of the first PMOS and NMOS source current transistors 54 and 62. The dynamic characteristic of this output signal in cooperation with a scale factor between the W/L rations first PMOS and NMOS source current transistors 54 and 62 and the transistors in the sense amp 10 controls the sense amplification rate during the first stage (III) of the sense amplification phase.

At the end of the first stage (III) the amplitude of the differential signal voltage has begun to increase and has stabilized. When the amplitude of the signal reaches a second predetermined value the outputs of the second slave clock 76 are clocked to activate the second PMOS and NMOS source current transistors 56 and 64. The W/L ratios of these transistors are scaled relative to transistors in the sense amp 10 to increase the rate of sense amplification.

Finally, at the end of period IV the amplitude has reached a third predetermined level and the output of the third slave clock 78 is clocked to increase the sense rate so the maximum amplified signal value, $V_{CC}$, is rapidly attained.

The clocking circutry 70 thus tracks the increase of the amplitude of the differential voltage signal as a function of time and activates the various source current transistors 54, 56, 58, 62, 64, 66 when the amplitude reaches predetermined levels. This tracking is accomplished by utilizing circuit elements in the clocking circuit that emulate the characteristics of corresponding circuit elements in the sense amp and memory cell. For example, the tracking circuit 72 includes transistors having fabrication parameters identical to the transistor switched transfer gates. This emulation technique provides for reliable operation and optimal performance of the memory over wide ranges of temperatures and fabrication process parameter variations.

Figure 4:
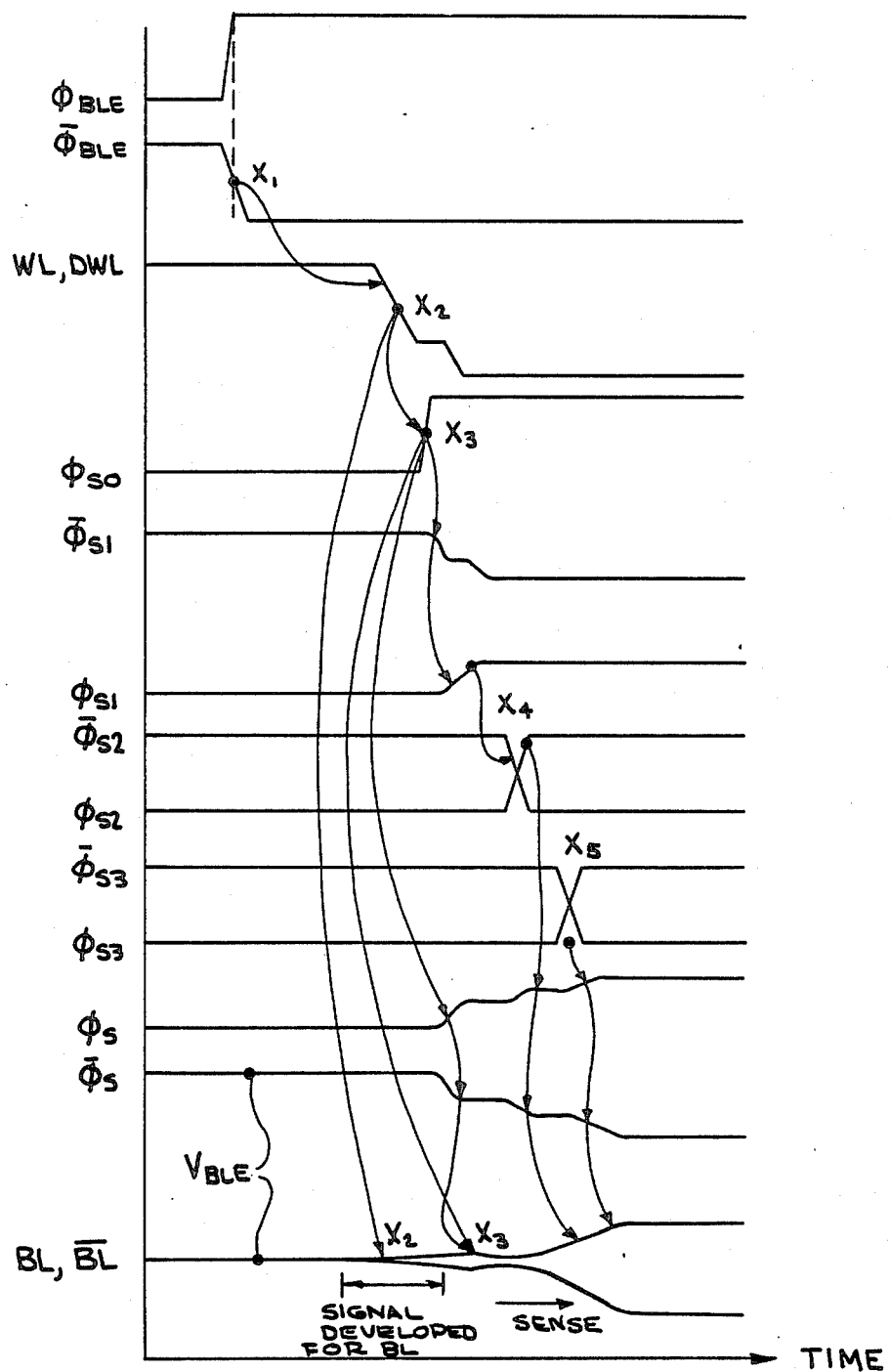
FIG. 4 is a timing diagram illustrating the functioning of the invention.

A more detailed description of the present invention will now be presented with reference to FIG. 4 which is a waveform type timing diagram describing the operation of the circuitry depicted in FIGS. 1 and 2.

Referring now to FIG. 4, at time $x_0$ the $\overline{RAS}$ signal is clocked low to end the precharge cycle and begin the sense cycle. At time $x_1$, $\phi_{SP}$, $\overline{\phi_{SP}}$, $\phi_{BLE}$, and $\overline{\phi_{BLE}}$ are clocked to isolate the bit lines 32 and 34 and source nodes 20 and 26 from each other and from the $V_{BLE}$ terminal 86. At time $x_2$ the word line is pulled low enough for the differential sense voltage to begin developing on the bit lines 32 and 34.

At time $x_3$ the differential sense voltage has reached a first predetermined value equal to about 90% of its maximum value. Thus, at time $x_3$ $\phi_{S0}$ is clocked and to initiate the first stage of the sense amplification phase and the first slave clock 72 begins its cycle. As $\phi_{S1}$ and $\overline{\phi_{S1}}$ increase, the voltage level at the PMOS source node 20 begins to increase and the voltage level at the NMOS source node 26 begins to decrease due to current flow through the first PMOS and NMOS source current supply transistors 54 and 62. As source current is supplied to the terminals the differential voltage signal amplitude starts to droop and the signal is very unstable. Accordingly, the rate of amplification is low to prevent signal loss. It is critical that the source voltages at the latches be controlled during this time period to avoid loss of the signal. The dynamic characteristic of the $\phi_{S1}$ and $\overline{\phi_{S1}}$ signals are tailored to avoid such signal loss.

At time $x_4$, the amplitude of the differential voltage signal has begun to increase and is equal to a second predetermined value. The second slave clock 76 then begins its cycle and $\phi_{S2}$ and $\overline{\phi_{S2}}$ are clocked to increase the amplification of the differential voltage signal. At time $x_5$ the third slave clock 78 begins its cycle and clocks $\phi_{S3}$ and $\overline{\phi_{S3}}$ to latch the bit lines to the full sense value.

Figure 5:
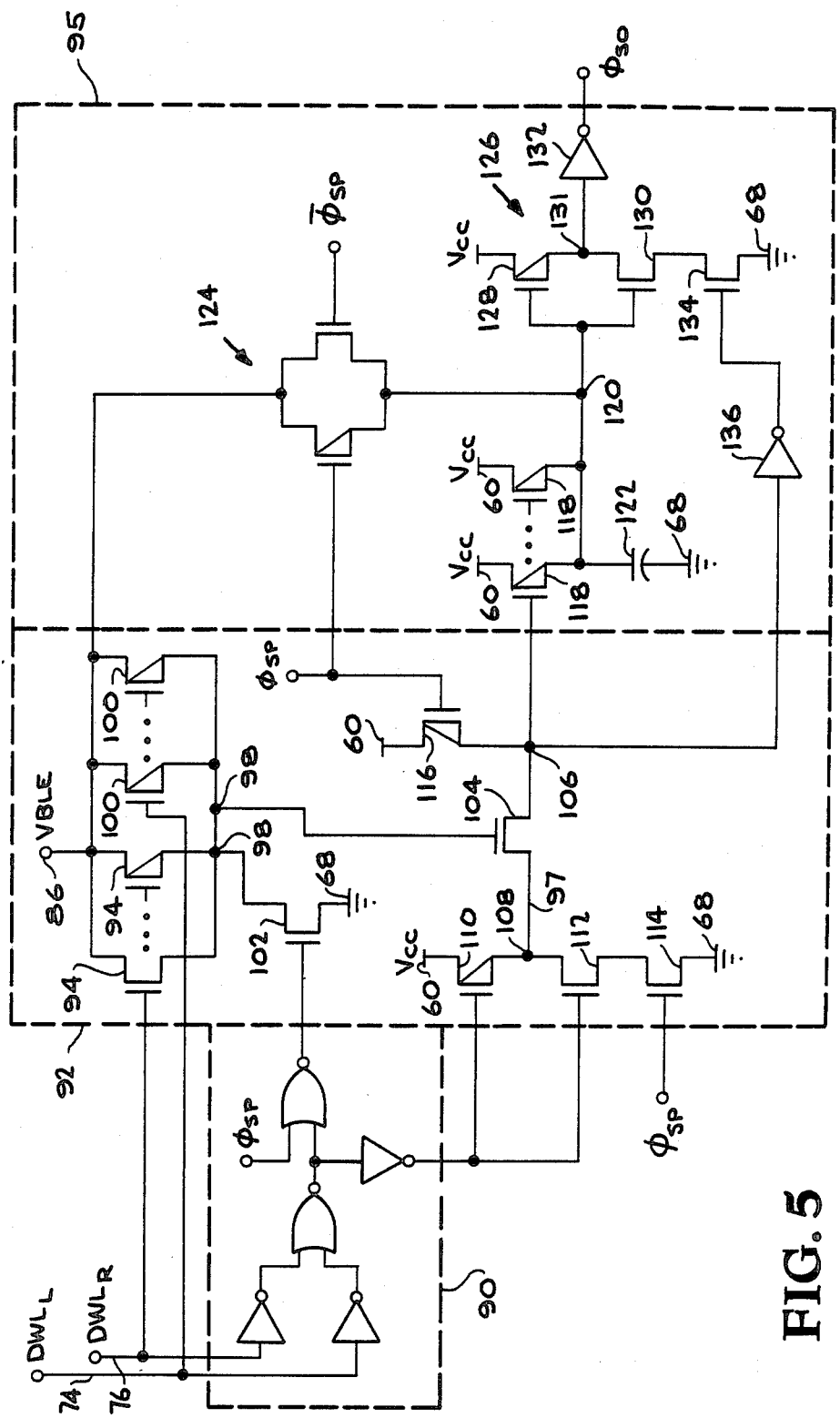
FIG. 5 is a circuit diagram of the tracking circuit.

FIG. 5 is a circuit diagram of the tracking circuit 72. Referring now to FIG. 5, for convenience of description, the circuit is divided into a gating circuit group 90, a detection circuit group 92, and a tracking circuit group 94. The function of the entire circuit of FIG. 5 is descrioed in detail below.

The gating circuit group 90 has inputs coupled to the dummy word lines 74 and 76. The gating circuit group 90 provides selected outputs when either of the dummy word lines 74 and 76 are clocked low at the initiation of a sense cycle.

The detection circuit group 92 includes a first set of PMOS detection transistors 94 having their sources coupled to a $V_{BLE}$ terminal 96, their drains coupled to circuit node 98, and their gates coupled to the right dummy word line 76. A second set of PMOS detection transistors 100 have their sources coupled to the $V_{BLE}$ terminal 86, their drains coupled to circuit node 98, and their gates couled to the left dummy word line 74. NMOS transistor 102 couples node 98 to ground. The gate of transistor 102 is coupled to a first output of the gating circuit group 90. NMOS transistor 104 has its gate connected to node 98, a first terminal connected to circuit node 106 and a second terminal connected to circuit node 108.

Circuit node 108 is coupled to $V_{CC}$ terminal 60 by PMOS transistor 110. additionally, circuit node 108 is coupled to the ground terminal by series connected NMOS transistors 112, 114. The gates of transistors 110 and 112 are coupled to a second output from the gating circuit group 90. The gate of transistor 114 is coupled to the $\phi_{SP}$ clock. Circuit node 106 is coupled to the $V_{CC}$ terminal 60 by PMOS transistor 116. PMOS transistor 116 has its gate coupled to the $\phi_{SP}$ clock.

Circuit node 106 is coupled to the gates of a set of tracking PMOS transistors 118 in the tracking circuit group 94. The sources of transistors 118 are coupled to the $V_{CC}$ terminal 60 and the drains are coupled to circuit node 120. A tracking capacitor 122 is coupled between the circuit node 120 and the ground terminal 68.

Circuit node 120 is coupled to the $V_{BLE}$ input 96 by a CMOS transmisson gate 124 clocked by $\phi_{SP}$ and $\phi_{\overline{SP}}$.

Circuit node 120 is coupled to the gates of a CMOS inverter 126. The CMOS inverter 126 is formed by series connected PMOS transistor and NMOS transistor 128 and 130. The output 131 of the CMOS inverter is coupled to the input of a second inverter 132. The source terminal of transistor 130 is coupled to the ground terminal 68 by NMOS transistor 134. The gate of transistor 134 is coupled to circuit node 106 through an inverter 136.

The output of the inverter 132 is the $\phi_{S0}$ signal.

Briefly, the function of the tracking circuit 72 is to delay the clocking of $\phi_{S0}$ until the differential signal voltage on the bit lines has attained the first predetermined value.

Figure 6:
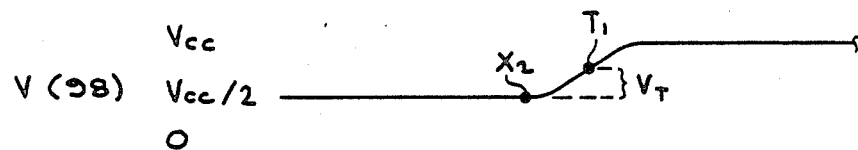
FIG. 6 is a timing diagram illustrating the functioning of the tracking circuit.
Figure 6:
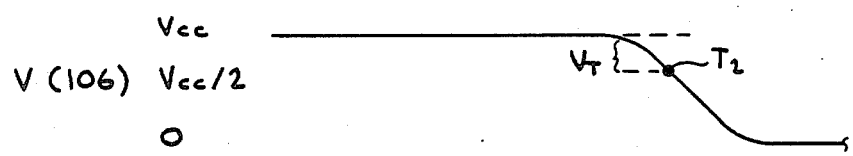
Figure 6:
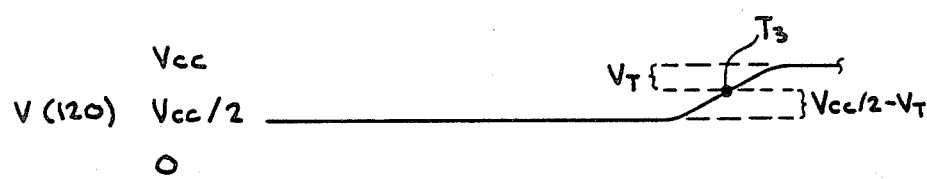
Figure 6:
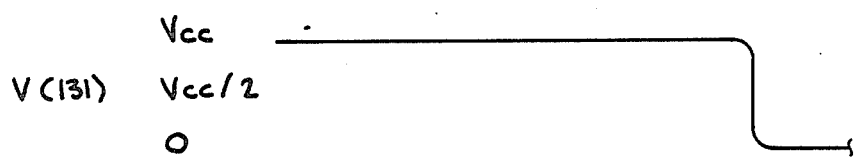
Figure 6:

The function of the circuit of FIG. 5 will now be described in more detail with reference to the timing diagram depicted in FIG. 6 and also with reference to the timing diagram depicted in FIG. 4. Times previously defined with reference to FIG. 4 are denoted with the $x_i$ value established in FIG. 4. Times defined in FIG. 6 are denoted $t_i$. Prior to the initiation of the sense cycle the voltage at node 98 is tied to ground by transistor 102, the voltage at node 108 is precharged to $V_{CC}$ via transistor 110, the voltage at node 106 is precharged to $V_{CC}$ via transistor 116, the voltage at node 120 is precharged to $V_{BLE}$ through the transmission gate 124, the voltage at node 131 is precharged to $V_{CC}$ through transistor 128, and the $\phi_{S0}$ signal is low. Node 98 is isolated from the $V_{BLE}$ terminal 86 because the transistors 94 and 100 are in the non-conducting state.

When the sense cycle is initiated by clocking $\overline{RAS}$ low, nodes 98 and 106 are isolated from $V_{CC}$ and node 120 is isolated from the $V_{BLE}$ terminal 86 due to the clocking of the $\phi_{SP}$ and $\phi_{\overline{SP}}$ signals.

At time $x_1$ one of dummy word lines, e.g. $DWL_R$, is clocked low. At time $x_2$, the PMOS transistors 100 conduct and the voltage on node 98 begins to rise.

The first and second sets of detection PMOS transistors 94 and 100 are designed to emulate the characteristics of the transfer gate 40. Accordingly, node 98 starts to charge at the same time ($x_2$ in FIG. 4) that the bit line 34 starts to charge. The second output signal from the gating circuit group 90 and $\phi_{SP}$ activate transistors 112 and 114 to couple node 108 (and the source terminal of transistor 104) to ground. At time $t_1$ the voltage at node 98, and at the gate of transistor 104, is greater tran $V_T$ (the threshold voltage of transistor 104) and transistor 104 conducts to discharge node 106.

Circuit node 106 is coupled to the gates of the set of tracking PMOS transistors 118 in the tracking circuit group 94. Accordingly, when node 106 discharges the tracking circuit group 94 is triggered. Thus, the detection circuit group 92 functions to detect the clocking of the dummy word line. At time $t_2$ the voltage at node 106 has dropped to $V_{CC}-V_T$ and transistors 118 begin to charge node 120.

The set of tracking transistors 118 and the tracking capacitor 122 are designed to emulate transfer gates 40 and storage capacitors 44 in the array. Thus, the charging rate of circuit node 120 tracks that of the storage node 37.

As described above, the time to fully transfer charge between storage capacitor 44 and the bit line 32 is long in relation to the desired access time in a high speed memory. Accordingly, it is desired to clock $\phi_{S0}$ when the differential signal voltage reaches a first predetermined value, e.g., 90% of its maximum value. Thus, the tracking circuit group 94 must clock $\phi_{S0}$ when the voltage at node 120 is a predetermined percentage of $V_{CC}$. This clocking is accomplished as follows.

The W/L ratio of the PMOS transistor 128 and CMOS inverter 126 is much larger than the W/L ratio of the NMOS transistor 130 so that the trigger points of inverter 126 is $V_{CC}-V_T$. Therefore, the output of CMOS inverter 126 remains high until the voltage at node 120 is charged to $V_{CC}-V_T$.

At time $t_3$ the voltage at node 120 is equal to $V_{CC}-V_T$ and the voltage change, resulting from charging node 120 from $V_{CC}/2$, is equal to $V_{CC}/2-V_T$. Thus, $\phi_{S0}$ is clocked when the voltage change is a predetermined percentage of its maximum. By controlling the size of capacitor 122 this clocking time, $x_3$ of FIG. 4, occurs when the differential signal voltage on the bit lines is equal to about 90% of its maximum value.

Figure 7:
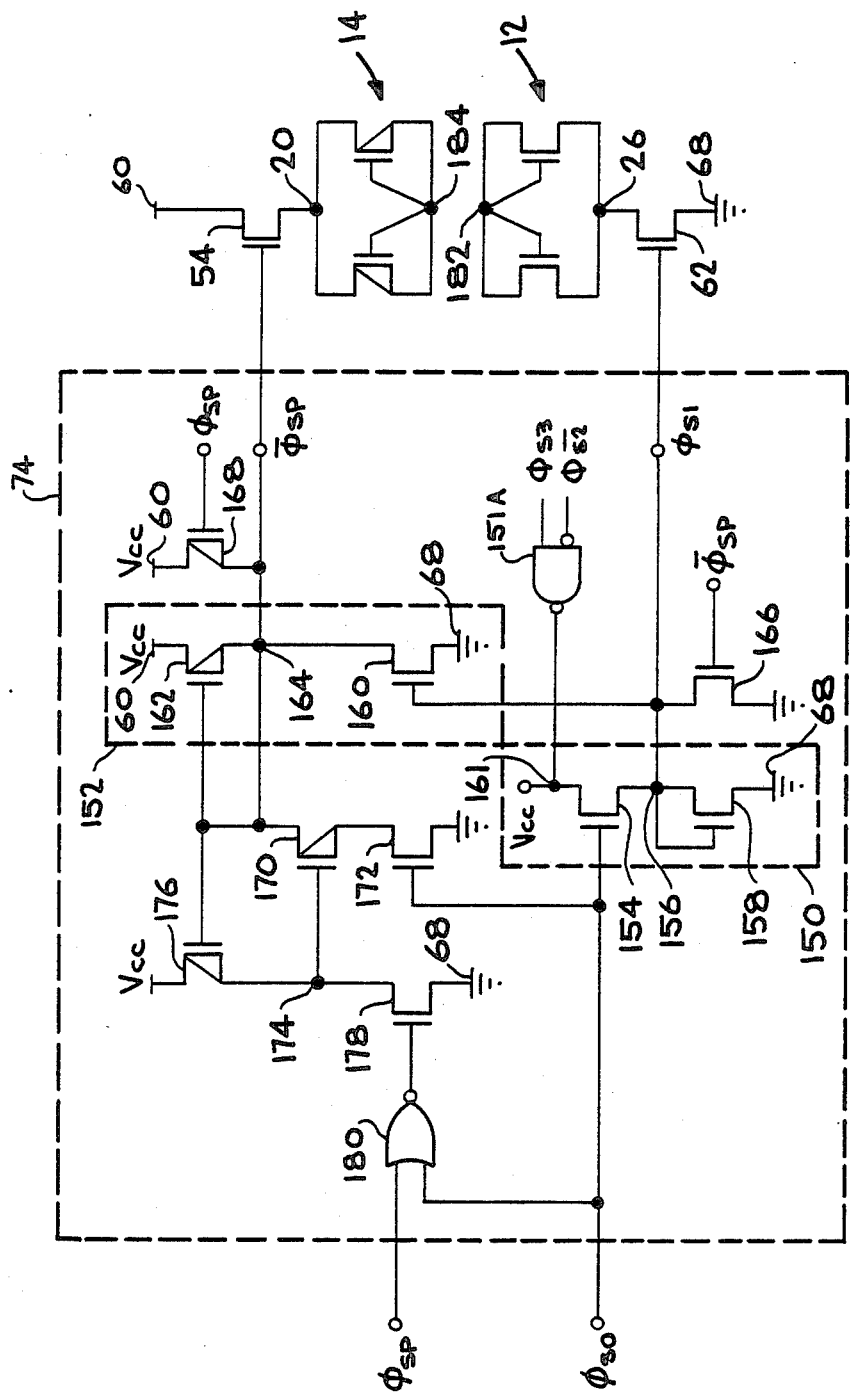
FIG. 7 is a circuit diagram of the first slave clock.

FIG. 7 is a circuit diagram of the first slave clock 74. Briefly, the first slave clock 74 has two important functions. The first is to control the initial rate of application of source current to the source terminals 20 and 26 of the sense amp 10 and the second is to equalize the amount of current supplied to the PMOS source terminal 20 and the NMOS source terminal 26.

Both of these functions are critical to avoid signal loss during the initial stage of sense amplification.

As described above, parasitic source-gate coupling in the transistors of the latches 12 and 14 can cause signal loss if the amplitude of the current initially applied to the source terminals 20 and 26 is too large. Referring back to FIG. 4, note that the magnitude of the differential sense voltage signal may actually decreases during the first stage of sense amplification due to mismatch of circuit parameters. This first stage is thus very critical and its dynamics must be carefully controlled.

Additionally, if the source current applied to the PMOS source terminal 20 and NMOS source terminal 26 is not equal, then any difference in capacitance between the left and right bit lines 32 and 34 can cause signal loss.

In the present invention, this initial source current control is achieved by controlling the dynamic characteristic of the gate voltages, $\phi_{S1}$ and $\phi_{\overline{S1}}$, applied to the gates of the first PMOS and NMOS source current transistors 54 and 62.

In FIG. 7 several of the circuit elements are grouped to form a bias circuit 150 and a current mirror circuit 152. This grouping is for convenience of description only. The remaining circuit elements in the circuit of the first slave clock are utilized for precharge and gating. The bias circuit 150 is formed by a first biasing NMOS transistor 154 having its drain terminal coupled to a virtual $V_{CC}$ terminal 151 and its source terminal coupled to circuit node 156 which forms a $\phi_{S1}$ terminal. The virtual $V_{CC}$ terminal 151 is coupled to the output of NAND gate 151A and the inputs of NAND gate 151A are coupled to the $\phi_{S3}$ and inverted $\phi_{\overline{S3}}$ signals. The NAND gate 151A clocks the virtual $V_{CC}$ terminal 151 low to cut off current through the biasing circuit 150 after the first and second stages of the sense amplification phase are completed. Power dissipation is, thus, reduced. During the third stage, current flow is controlled by the third source current transistors 58, 66 and the bias circuit 150 is not needed. A second biasing NMOS transistor 158 has its drain terminal coupled to node 156, its source terminal coupled to ground terminal 68, and its gate coupled to circuit node 156.

The current mirror circuit group 152 includes series connected first and second current mirror transistors 160 and 162. The source of second current mirror transistor 162 is couple to the $V_{CC}$ terminal 60, its drain is coupled to circuit node 164, which forms a $\phi_{\overline{S1}}$ terminal, and its gate is coupled to circuit node 164. The drain of the first current mirror transistor 160 is coupled to circuit node 164, its source is coupled to the ground terminal 68, and its gate is coupled to circuit node 156. Circuit node 156 is coupled to the ground terminal 68 by NMOS transistor 166. NMOS transistor 166 is gated by the $\phi_{\overline{SP}}$ signal. The circuit node 164 is coupled to the $V_{CC}$ terminal 60 by PMOS transistor 168. PMOS transistor 168 is gated by the $\phi_{\overline{SP}}$ signal.

Circuit node 164 is connected to ground by a series circuit formed by PMOS transistor 170 and NMOS transistor 172. The gate of transistor 170 is coupled to circuit node 174. Circuit node 174 is coupled to the $V_{CC}$ terminal by PMOS transistor 176 and to the ground terminal 68 by NMOS transistor 178. The gates of transistors 154 and 172 are coupled to the $\phi_{S0}$ signal and the gate of transistor 178 is coupled to the $\phi_{SP}$ and $\phi_{S0}$ signals routed throuoh NOR gate 180.

The voltage developed at circuit node 156 comprises the $\phi_{S1}$ signal. This voltage is coupled to the gate of the first NMOS current sink transistor 62. The source terminal of the first NMOS source current sink transistor 62 is coupled to the ground terminal 68 and the drain is coupled to the NMOS source terminal 26. The cross-coupled transistors 22 and 24 of the NMOS latch 14 are depicted having their gates coupled to a common circuit node 182. Similarly, the voltage developed at circuit node 164 is the $\phi_{\overline{S1}}$ signal which is coupled to the gate of the first PMOS source supply transistor 60. The source terminal of the first PMOS source transistor 54 is couped to the $V_{CC}$ terminal 60 and the drain terminal is coupled to the PMOS source terminal 20. The cross-coupled PMOS transistors of the PMOS latch 14 are shown having their gates coupled to a common terminal 184.

The gate terminals of the transistors in the NMOS and PMOS latches are shown coupled to common nodes 182 and 184 respectively. The voltage at these common nodes is equal to $V_{CC}/2$ because prior to sensing both bit lines are precharged to $V_{CC}/2$. At the beginning of the sense amplification phase, it is desired to bias the NMOS source terminal 26 at $V_{CC}/2-V_T$ to set $V_{GS}$ of the NMOS transistors in the NMOS latch 12 equal to $V_T$ so that a very small current flows through the transistors in the latch 14. This small current is required to prevent the source gate coupling from destroying the signal.

The biasing of node 6 is accomplished by the bias circuit group 150.

The function of the biasing circuit group 150 will now be described. The purpose of the biasing circuit group 150 is to set the voltage level at the source node 26 so that a very low level of current flows through the transistors of the latch 12 during the initial stage of sense amplification.

During precharge, the voltage level at node 182, and at the gates of the transistors in the latch 12, is established at $V_{CC}/2$. Accordingly, the transistors in the latch 12 will conduct when the gate source voltage, $V_{GS}$, is about equal to the threshold voltage of the transistor, $V_T$, i.e., when the voltage at the NMOS source node 26 is about equal to $V_{CC}/2-V_T$.

The biasing circuit 150, in cooperation with the first source current sink transistor 62, establishes the voltage at node 26 at a level slightly less than $V_{CC}/2-V_T$ to provide minimal source current during the critical initial stages of sense amplification, thereby preventing signal loss. This control of the voltage level at node 26 is achieved by scaling the channel width to length ratios (W/L) of the biasing transistors 154, 158, the first NMOS source current transistor 62, and the transistors in the latch 12.

All transistors in the circuit are biased to operate in the saturation region so that the current, $I_{DS}$, is dependent only on the source gate voltage difference $V_{GS}$. For the transistors to be in saturation, $V_{DS}$ must be greater than or equal to $V_{GS}\cdot V_T$ where $V_{DS}$ is the voltage difference between the drain and the source of the transistor. Accordingly, for the first source current transistor 62 to operate in saturation $$V(26) \geq V(156) - V_T \tag{1}$$

where any quantity, such as V, $I_{DS}$, or W/L followed by a parenthesis with a reference numeral enclosed refers to the value of that quantity for the circuit element identified by that reference numeral.

The maximum $V_{GS}$ consistent with equation (1) is desired so that $$V(26) = V(156) - V_T \tag{2}$$

In the preferred embodiment, the value of V(26) is to be established at $4/5 (V_{CC}/2 - V_T)$ to control the initial rate of sense amplification. Accordingly V(156) must be established at $(2/5 V_{CC} + 1/5 V_T)$ to be consistent with equation (2).

The current through a transistor operating at saturation is given by the following relationship:

$$I_{DS} = C(W/L)(V_{GS} - V_T)^2 \tag{3}$$

where C is a constant. The quantities $I_{DS}(154)$ and $I_{DS}(158)$ are equal because the biasing transistors 154 and 158 are connected in series. If the ratio of W/L (154) to W/L (158) is 4:9 then V (156) has the desired value of $(2/5 V_{CC} + 1/5 V_T)$.

Having established the level of the gate voltage on the first source current transistor 62, i.e., V (156), at the desired level it is now necessary to establish the desired value of V (26). This value is established by controlling the ratio of W/L (26) to the W/L of the transistors in the latch 12. Utilizing equation (3), if these rations are 1:5 then V (26) is the desired value of $4/5(V_{CC}/2 - V_T)$.

As described above, it is critical during the first stage of the sense amplification phase that the current supplied to the PMOS source terminal 20 is equal to the current sunk from the NMOS source terminal 26. This equalization of source current is achieved by the current mirror circuit group 152 in cooperation with the first PMOS and NMOS current source transistors 54 and 62.

Circuit nodes 156 and 164 are biased during precharge to make the first source current transistors 54 and 62 non-conductive. Circuit node 156 is biased to $V_{CC}$ via transistor 168 and circuit node 156 is biased to ground by transistor 166.

The gates of the first source current sink transistor 62 and first current mirror transistor 160 are both coupled to node 156 and their sources are both coupled to the ground terminal 168. Thus, the current through the first NMOS source sink transistor 62 and the first current mirror transistor 162 are equal except for a scale factor N, determined by the W/L ratios of the two transistors. In the present embodiment, the current through the first NMOS source current transistor 62 is equal to the current through the first current mirror transistor 160 multiplied by N.

The current mirror transistors 160 and 162 are coupled in series so that the current through each transistor is equal. The gates of the second current mirror transistor 162 and the first PMOS source supply current transistor 54 are coupled to the common node 164 and their sources are both coupled to the $V_{CC}$ terminal 60. Accordingly, the $V_{GS}$ of each transistor is equal and the current flowing through the transistors is equal except for a scale factor determined by the W/L ratios of the two transistors. In the present embodiment, the current through the first PMOS source supply transistor 54 is soaled to equal to the ourrent through the second current mirror transistor 162 multiplied by the scale factor N. Thus, the currents supplied to the PMOS source terminal 20 and sunk from the NMOS source terminal 26 are equal and the problem of signal loss during the initial sense amplification stage is obviated.

Special circuitry for discharging node 164 is required to prevent the initialization of current flow through the first PMOS source current transistor 54 from lagging behind the first NMOS source current transistor 62. As described above, node 164 is precharged to $V_{CC}$ and charge is stored at node 164 due to its inherent capacitance. Current initialization through the first NMOS source current transistor 62 and NMOS current mirror transistor 160 occur nearly simultaneously because their gates are coupled.

However, if node 164 were at $V_{CC}$, the initial current through the NMOS transistor 160 would constitute charge required to lower the voltage level on node 164 from $V_{CC}$ to $V_{CC}-V_T$. Current flow through the PMOS current mirror transistor 162 and the first PMOS source current transistor 54 would be delayed until node 164 were pulled to $V_{CC}-V_T$. Thus, current would be supplied to NMOS source terminal 26 before the PMOS source terminal 20 and the signal might be lost.

In the present system, the voltage level at node 164 is clamped at $V_{CC}-V_T$ prior to source current initialization to prevent this time delay.

At the start of the sense cycle, $\phi_{SP}$ is clocked and nodes 164 and 156 are isolated from $V_{CC}$ and ground, respectively. At time $y_1$, $\phi_{SO}$ has not been clocked and is low while $\phi_{SP}$ is high. Accordingly, the voltage at the gate of transistor 178 is high and transistor 178 conducts. Transistor 176 is off because the gate voltage is $V_{CC}$, since node 164 is at $V_{CC}$. Node 174 is held at ground by transistor 178 and transistor 170 is on. Transistor 172 is off because $\phi_{SO}$ is low.

At that time, $y_2$, $\phi_{SO}$ has increased to $V_T$. Transistor 172 is switched on and 178 is switched off. The voltage level at node 164 begins to drop because current flows through transistors 170 and 172 to ground.

At time $y_3$, the voltage level at node 164 has dropped to $V_{CC}-V_T$. Transistor 176 is switched on to discharge node 174 to $V_{CC}$. Thus, transistor 170 is switched off and the discharging of node 164 is terminated. Accordingly, node 164 is clamped at $V_{CC}-V_T$.

At time $y_4$, current flow through the NMOS current mirror transistor 160 and first NMOS source current transistor 62. Because node 164 is at $V_{CC}-V_T$, current flow is immediately initiated through the PMOS mirror transistor 162 and the first PMOS source current transistor 54. The time lag for discharging node 164 from $V_{CC}$ to $V_{CC}-V_T$ has been eliminated.

Figure 8:
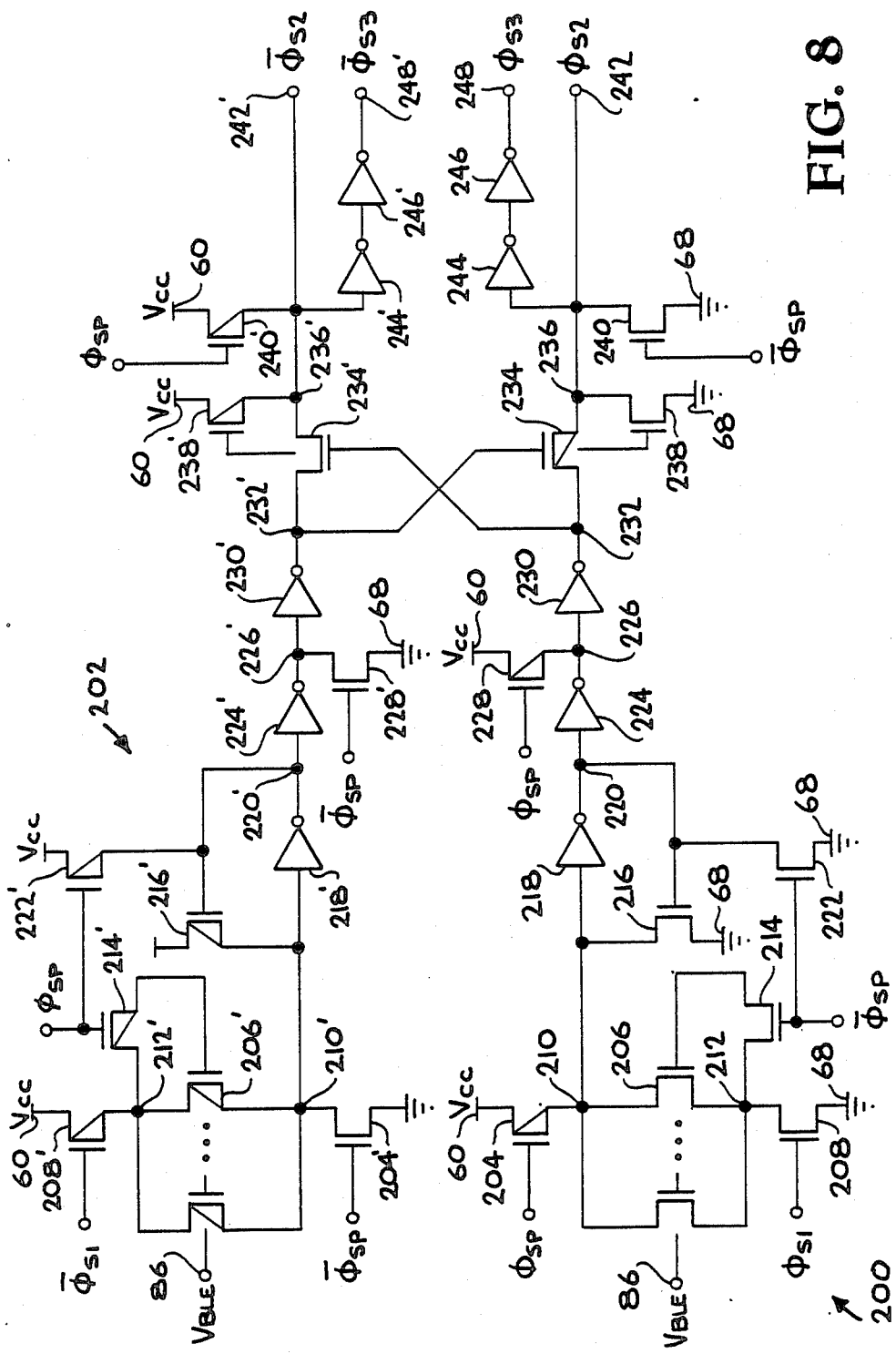
FIG. 8 is a circuit diagram of the second and third slave clocks.

FIG. 8 is a circuit diagram for the second and third slave clocks 76 and 78. The purpose of the second slave clock is to delay clocking $\phi_{S2}$ and $\phi_{\overline{S2}}$ until the amplitude of the differential voltage signal developed on the bit lines is greater than a third predetermined value. This third predetermined value is selected so that the signal is stable and will not be lost if the rate of sense amplification is increased.

The circuit includes circuit elements that emulate the transistors in the sense amp 10 and the first PMOS and NMOS source current transistors 54 and 62 to switch the second slave clock outputs when the amplitude of the differential signal voltage is at least 100 mv.

In FIG. 8 the circuit elements may be grouped into a lower group 200 and an upper group 202. The lower group 200 includes a series circuit formed by PMOS transistor 204, a set of NMOS latch-emulating transistors 206, and NMOS source current supply emulating transistor 208. Transistor 208 has its source coupled to the $V_{CC}$ terminal 60, its drain coupled to a bit line emulating circuit node 210, and its gate coupled to the $\phi_{SP}$ clock. The set of NMOS transistors 206 have their drains coupled to circuit node 210, their sources coupled to a circuit node 212, and their gates coupled to the $V_{BLE}$ terminal 86. Transistor 208 has its drain coupled to circuit node 212, its source coupled to ground terminal 68, and its gate coupled to the $\phi_{S1}$ signal.

NMOS transistor 214, has its drain coupled to the $V_{BLE}$ terminal 86, its source coupled to circuit node 212, and its gate coupled to the $\phi_{\overline{SP}}$ signal. NMOS transistor 216 is connected between node 210 and the ground terminal 68. An inverter 218 has its input coupled to circuit node 210 and its output coupled to a circuit node 220. The gate of transistor 216 is coupled to node 220. NMOS transistor 222 couples circuit node 220 to the ground terminal 68. The gate of transistor 222 is coupled to the $\phi_{\overline{SP}}$ signal.

Inverter 224 has its input coupled to circuit node 220 and its output coupled to a circuit node 226. Transistor 228 connects circuit node 226 to the $V_{CC}$ terminal 60. The gate of transistor 228 is coupled to the $\phi_{SP}$ signal.

Inverter 230 has its input coupled to circuit node 226 and its output coupled to a circuit node 232. A PMOS transistor 234 has a first terminal connected to circuit node 232 and a second terminal connected to a circuit node 236. An NMOS transistor 238 couples node 236 to the ground terminal 68. Additionally, another NMOS transistor 240 couples the circuit node 236 to the ground terminal 68 with the gate of transistor 240 coupled to the $\phi_{\overline{SP}}$ signal. The $\phi_{S2}$ output terminal 242 is also coupled to circuit node 236.

Series coupled inverters 244 and 246 couple the circuit node 236 to a $\phi_{S3}$ output terminal 248.

The upper group of circuit elements 202 in FIG. 8 are essentially the mirror image of the lower group 200. Each transistor in the upper group 202 is of the opposite polarity from the corresponding transistor in the lower group. Accordingly, circuit elements in the upper group 202 are given the same reference numeral as their corresponding elements in the lower circuit group 200 except that the reference numeral is primed.

The gates of transistors 234 and 238 are coupled to node 232' and the gates of transistors 234' and 238' are coupled to node 232.

The operation of the circuit will now be described. During the precharge cycle, $\phi_{SP}$ is low, transistor 204 conducts, and circuit node 210 is charged to $V_{CC}$. The value of $\overline{\phi_{SP}}$ is high so that transistor 214 conducts and circuit node 212 is charged to $V_{BLE}$ or $V_{CC}/2$. Because the voltage at circuit node 210 is high, the voltage at node 220 is low, the voltage at node 226 is high, and the voltage at node 232 is low. Similarly, the voltage at node 232' is high. Transistor 238 conducts because its gate is at $V_{CC}$ and its source is at ground so that node 236 is coupled to ground. Transistor 234 is non-conducting because both its terminals 232 and 236 are at zero volts and its gate is at $V_{CC}$. Accordingly, during precharge the output signal $\phi_{S2}$ is at ground, or zero volts.

When the sense cycle is initiated by clocking $\overline{RAS}$ low, $\phi_{SP}$ and are clocked to isolate nodes 210 and 212.

Transistors 206 are designed to emulate the characteristics of the transistors in the NMOS cross-coupled latch 12. As described above, during precharge, the gates and sources of the latch emulating transistors 206 are biased to $V_{BLE}=V_{CC}/2$ as are gates and sources of the transistors in the NMOS latch 14. The gates of the source currents emulating transistor 208 and the first NMOS source current supply 62 are both coupled to $\phi_{S1}$ and their source are biased at $V_{CC}/2$ during precharge. Therefore $V_{GS}$ of both transistors is equal. Accordingly, due to the emulation of the transistors in the latch 12 and the first NMOS source current transistor 62, as $\phi_{S1}$ is increased the rate of decrease of voltage level on the bit line emulating node 210 tracks the rate that the voltage on the low bit line is pulled down by the NMOS latch.

The W/L ratios of the NMOS latch and source current emulating transistors 206 and 208 are scaled relative to the transistors in NMOS latch 14 and first NMOS source current transistor 62 so that the voltage level of bit line emulating node 210 decreases to about $V_{CC}-V_T$ when the amplitude of the differential voltage signal has been amplified to at least about 100 millivolts.

When the voltage on node 210 decreases to $V_{CC}-V_T$ the output of inverter 218 begins to increase. Feedback through transistor 216 rapidly pulls down node 210 so that the output of inverter 218 rapidly rises to $V_{CC}$.

With node 220 high, node 226 is low, and node 232 is high. Similarly, node 232' is pulled low.

Because node 232 is high, the source voltage of transistor 234 is high and because node 232' is low, the gate voltage of transistor 234 is low. Accordingly, $V_{GS}(234)$ is low and transistor 234 conducts. Similarly, the low voltage state at node 232 which is coupled to the gate of transistor 238, turns off transistor 238 and isolates node 236 from ground. Accordingly, node 236 is charged to $V_{CC}$ through transistor 234 and the output signal $\phi_{S2}$ is now high.

The upper group of circuit elements 202 similarly emulates the pull up of the bit line coupled to the sense amp having the higher signal voltage. The signa $\phi_{\overline{S2}}$ is clocked at the same time as the signal $\phi_{S2}$ due to the coupling between transistors 234, 238, 234' bar, and 238' bar.

The outputs, $\phi_{S2}$ and $\phi_{\overline{S2}}$ are coupled to the gates of the second PMOS and NMOS source current transistors 56 and 64. The current supplied and sunk from the source nodes 20 and 26 is increased because the W/L ratio of the second source current transistors 56 and 64 is increased relative to the W/L ratios of the first source current transistors 54 and 62. The delay resulting between the clocking of the first slave clock 74 and the second slave clock 76 assures that the magnitude of the differential sense voltage is of sufficient magnitude that the increased rate of sense amplification will not destroy the signal.

The series coupled inverters 244 and 246 delay the clocking of the $\phi_{S3}$ signal by a fixed amount. This delay is not as critical as the delay between $\phi_{S1}$ and $\phi_{S2}$ because of the above-described stability of the differential signal subsequent to the application of $\phi_{S2}$. $\phi_{S3}$ and $\phi_{\overline{S3}}$ signals are applied to the gates of the third source current supply transistors 58 and 68 which have very large W/L ratios for rapidly increasing the amplitude of the source current and the sense amplification rate. The amplitude differential voltage signal is now rapidly amplified to the full $V_{CC}$ signal value to further increase the sense amplification rate and to latch the bit lines at the full sense signal values.

The invention has been explained with reference to specific embodiments. Other embodiments will now be apparent to those of ordinary skill in this art. For example, the invention could be utilized in a memory having NMOS transfer gates disposed in a P type well. Additionally, the principles of the invention are applicable to a memory utilizing bipolar latches with complementary PNP and NPN transistors. Accordingly, it is therefore not intended that the invention be limited except as indicated by the appended claims.

What is claimed is:

1. A system for controlling the amplification rate of the differential voltage signal developed at inputs of a CMOS sense amp of the type having a pull-up latch, with a first source node, and a pull-down latch, with a second source node, said system comprising:
    means for determining when the amplitude of the differential voltage signal is equal to a first predetermined level;
    means for establishing the amplification rate at a first selected value when the magnitude of the differential voltage signal is between the first and a second predetermined value to prevent signal loss; and
    means for increasing the amplification rate to a second selected value when the amplitude of the differential signal voltage is above the second predetermined level to decrease the duration of the sense cycle.

2. The invention of claim 1 further comprising:
    means for increasing the sense amplification rate from said second selected value to a third selected value when the amplitude of the differential voltage signal has increased from the second predetermined level to a third predetermined level to further decrease the duration of the sense cycle.

3. A system for controlling the amplification rate of a differential voltage signal developed at the inputs of a CMOS sense amplifier of the type having a pull-up latch, with a first source node, and a pull-down latch, with a second source node, said system comprising:
    means for determining when the differential voltage signal has attained a first predetermined value;
    means for biasing a selected one of said source nodes at a selected voltage level to control the source current at said selected node when said differential voltage signal has attained said first predetermined value; and means for equalizing the source current at both of said nodes.

4. The invention of claim 3 further comprising:

means for selecting said first predetermined voltage value to be a desired percentage of the maximum possible value of the differential voltage signal.

5. A sense amplifier clocking system for use with a CMOS sense amplifier in a CMOS memory array coupled to an external voltage supply, having $V_{CC}$ and ground terminals, with the CMOS sense amp being of the type having a pull-up latch including cross-coupled transistors of a first conductivity type with coupled first source terminals and having an pull-down latch including cross-coupled transistors of a second conductivity type with coupled second source terminals, with the inputs of said CMOS sense amplifier coupled to left and right bit lines, with one of the bit lines selectively coupled to the storage node of a storage cell through a transistor switch transfer gate, activated by clocking a word line control signal, to generate a differential voltage signal being the difference between the voltage levels on a high bit line and a low bit line, and with the differential voltage signal having a maximum possible value, $\Delta$, determined by the quantum of charge stored in the storage cell, with the first and second coupled source terminals and the bit lines precharged to about $V_{CC}/2$ prior to the sense cycle, and with the CMOS sense amplifier for amplifying the magnitude of the differential voltage signal to $V_{CC}$ by simultaneously pulling the voltage level on the high bit line up to $V_{CC}$ and pulling the voltage level on the low bit line down to zero, said clocking system comprising:

means for initializing the sense amplification phase of the sense cycle when the amplitude of the differential voltage signal achieves a first predetermined value;

means for maintaining the amplitude of the source current at the coupled source terminals of one of the latches below a first predetermined level during the first stage of the sense amplification phase;

means for equalizing the source current at the first and second coupled source terminals of the sense amplifier during the first stage of the sense amplification phase;

means for detecting when the amplitude of the differential voltage signal achieves a second predetermined value indicating the completion of the first stage of the sense amplification phase of the sense cycle; and means for increasing the amplitude of the source current at the first and second coupled source terminals of the sense amplifier upon completion of the first stage of the sense amplification phase to rapidly amplify the magnitude of the differential voltage signal to the full $V_{CC}$ signal value.

6. The invention of claim 5 wherein said means for detecting when the amplitude of the differential voltage signal achieves the first predetermined value comprises:

a tracking capacitor designed to emulate the capacitance of the bit line and storage cell;

a tracking transistor, designed to emulate the transistor switch transfer gate, for charging said tracking capacitor at a rate that tracks the rate that charge is transferred through the transistor switched transfer gate;

a detecting transistor designed to emulate the characteristics of the transistor switched transfer gate, for activating the tracking transistor upon detecting the initiation of the differential voltage signal generation phase of the sense cycle; and means for clocking a sense amplification phase initiating signal when said tracking capacitor is charged to a predetermined tracking voltage level, with the W/L ratios of said tracking capacitor and tracking transistor scaled relative to the characteristics of the bit line, storage cell, and transistor switched transfer gate so that the predetermined tracking voltage level is reached when the amplitude of the differential voltage signal is a predetermined percentage of $\Delta$.

7. The invention of claim 6 wherein the transistors in the pull-up latch are PMOS transistors and the transistors in the pull-down latch are NMOS transistors.

8. The invention of claim 7 where said means for maintaining comprises:

means for coupling the source terminal of the pull down latch to the ground terminal of the external voltage supply; and means for biasing the second source terminal at a predetermined fraction of $(V_{CC}/2 - V_T)$ to maintain the amplitude of the source current at the second source terminal below the first predetermined level.

9. The invention of claim 8 wherein said means for maintaining further comprises:

a first source current supply transistor having its drain coupled to the second source terminal and having its source coupled to the ground terminal of the external voltage supply;

means for generating a source current control voltage signal having a predetermined biasing amplitude at a $\phi_{S1}$ terminal;

means for coupling the gate of the first source current supply transistor to said $\phi_{S1}$ terminal;

with the W/L ratio of said first source current supply transistor scaled relative to the W/L ratio of the transistor in the pull-down latch so that the voltage level at the second source terminal is a predetermined fraction of $(V_{CC}/2 - V_T)$; and means for coupling said source current control voltage signal generating means to said sense amplification phase initiating signal to initiate the generation of said first source current control voltage signal when said sense amplification initiation signal is clocked.

10. The invention of claim 9 wherein said means for generating said source current control voltage signal comprises:

a first biasing transistor having its drain coupled to the $V_{CC}$ terminal, its source coupled to said $\phi_{S1}$ terminal, and its gate coupled to said sense amplification phase initiating signal; and a second biasing transistor having its drain and gate coupled to said $\phi_{S1}$ terminal and its source coupled to the ground terminal, with the W/L ratios of said first and second biasing transistors scaled to establish the voltage level at said $\phi_{S1}$ terminal at the predetermined biasing amplitude.

11. The invention of claim 10 wherein said means for equalizing comprises:

a first NMOS current mirror transistor, designed to emulate the circuit characteristics of the first NMOS source current transistor, having its gate coupled to said $\phi_{S1}$ circuit terminal so that the V$_{GS}$ of the first current mirror transistor and the first NMOS source current transistor are equal, and so that the current flowing through said first NMOS source supply transistor is equal to the current flowing through said first current mirror transistor multiplied by a scale factor, N;

a second PMOS current mirror transistor connected in series with said first NMOS current mirror transistor so that the amplitude of the current flowing through said first and second current mirror transistors is equal; and a first PMOS source current transistor, for supplying source current to the first source current terminal of the sense amplifier, with the gates of the second PMOS current mirror transistor and the first PMOS source current transistor coupled so that V$_{GS}$ of the second PMOS current mirror transistor and the first PMOS source current transistor are equal and so that the current in the first PMOS source current supply transistor is equal to the current in the second PMOS mirror transistor multiplied by the scale factor, N, and so that the amplitudes of the source current supplied to the P and N source terminals of the sense amplifier are equal.

12. The invention of claim 11 wherein said means for detecting when the amplitude of the differential voltage signal has attained a second predetermined value comprises:

a PMOS precharge transistor;

an NMOS latch emulating transistor, designed to emulate the characteristics of the pull-down cross-coupled latch of the sense amplifier, with the NMOS emulating transistor having its drain terminal coupled to the drain terminal of the PMOS precharge transistor at a common drain node, with said PMOS precharge transistor for charging said common drain node to a precharge voltage level, and with the gate of the NMOS latch emulating transistor biased at V$_{CC}$/2;

an NMOS source current supply emulating transistor, designed to emulate the characteristics of the first NMOS source supply transistor, having its drain coupled to the source of the NMOS latch emulating transistor and having its gate coupled to said $\phi_{S1}$ circuit terminal so that the V$_{GS}$ on said first source current transistor and on said NMOS source current supply emulating transistor are equal and the current flowing through said NMOS source current supply emulating transistor is equal to the current flowing through said first NMOS source current transistor multiplied by a scale factor, and so that the rate of change of the precharge voltage level at the common drain node tracks the rate of change of the voltage on the storage node; and output clocking means, coupled to said common drain node, for clocking a second stage sense amplification phase initiation signal when the voltage level on the coupled drain nodes indicates that the amplitude of the differential voltage signal has attained at least the second predetermined value.

13. The invention of claim 12 further comprising:

means for precharging the gates of said second PMOS current mirror transistor and said first PMOS source current transistor to V$_{CC}$ prior to the initiation of the sense amplification phase; and means for clamping the voltage level on said gates to about V$_{CC}$−V$_T$ during the first stage of the sense amplification phase to prevent delaying the supply of source current to the PMOS source terminal relative to the NMOS source terminal.

14. The invention of claim 13 wherein said means for increasing the source current at the source terminals of the sense amplifier comprises:

a second NMOS source current transistor having its drain coupled to said NMOS source node, its source coupled to ground, and its gate biased by said second stage sense amplification phase initiation signal, where said second NMOS source current transistor conducts when said second stage initiation signal is clocked by said output clocking means and where the W/L ratio of said second NMOS source current transistor is scaled to increase the amplitude of the sense current at said source terminal so that the rate of amplification of said differential voltage signal is increased; and a second PMOS source current transistor having its drain coupled to said PMOS source node, its source coupled to V$_{CC}$, and its gate biased by said second stage sense amplification phase initiation signal, where said second PMOS source current transistor conducts when said second stage initiation signal is clocked by said output clocking means and where the W/L ratio of said second PMOS source current transistor is scaled to increase the amplitude of the sense current at said source terminal so that the rate of amplification of said differential voltage signal is increased.

15. The invention of claim 14 with said means for increasing further comprising:

means for clocking a third stage sense amplification phase initiation signal at a predetermined time after the clocking of said second stage sense amplification phase signal;

a third NMOS source current transistor having its drain coupled to said second source terminal, its source coupled to ground, and its gate biased by said third stage sense amplification phase initiation signal, where said third NMOS source current transistor conducts when said third stage sense amplification signal is clocked, and where the W/L ratio of said third NMOS source current transistor is scaled to further increase the amplitude of the source current at said source terminal to rapidly increase the rate of amplification of said differential voltage signal so that the amplitude of the differential voltage signal rapidly attains its full V$_{CC}$ signal voltage value; and a third PMOS source current transistor having its drain coupled to said second source terminal, its source coupled to V$_{CC}$, and its gate biased by said third stage sense amplification phase initiation signal, where said third PMOS source current transistor conducts when said third stage sense amplification signal is clocked, and where the W/L ratio of said third PMOS source current transistor is scaled to further increase the amplitude of the source current at said source terminal to rapidly increase the rate of amplification of said differential voltage signal so that the amplitude of the differential voltage signal rapidly attains its full V$_{CC}$ signal voltage value.

16. A system for controlling the amplification rate of a differential voltage signal developed at first and second input nodes of a CMOS sense amplifier of the type having a pull-up latch, with a first source node, and a pull-down latch, with a second source node, the input nodes being precharged to an input node precharge level prior to a latching cycle, said system comprising:
- means for establishing the sense amplification rate at a first selected value, at the beginning of the latching cycle, to prevent signal loss;
- means for determining when both of the input nodes have reached voltage levels which differe from the input node precharge level by a predetermined amount; and
- means for increasing the sense amplification rate to a second selected value in response to the means for determining, the decrease the duration of the latching cycle.

17. A system according to claim 16, wherein the means for determining comprises:
- first and second emulation nodes;
- means for precharging the emulation nodes to an emulation precharge level corresponding to the input node precharge level, prior to the latching cycle;
- means for reducing the voltage at the first emulation node and increasing the voltage at the second emulation node at a rate corresponding to the first selected value, at the beginning of the latching cycle; and
- means for detecting when both of the emulation nodes have reached voltage levels which differ from the emulation precharge level by an amount corresponding to the predetermined amount.

* * * * *